(12) United States Patent
Ausseresse et al.

(10) Patent No.: US 9,041,433 B2
(45) Date of Patent: May 26, 2015

(54) SYSTEM AND METHOD FOR DRIVING TRANSISTORS

(71) Applicant: Infineon Technologies Austria AG, Villach (AT)

(72) Inventors: Pierrick Ausseresse, Munich (DE); Tushar Duggal, Neubiberg (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/924,280

(22) Filed: Jun. 21, 2013

(65) Prior Publication Data

US 2014/0375361 A1    Dec. 25, 2014

(51) Int. Cl.
*H03K 3/00* (2006.01)
*H03K 3/01* (2006.01)

(52) U.S. Cl.
CPC ........................................ *H03K 3/01* (2013.01)

(58) Field of Classification Search
USPC .......... 327/108–110, 387–391; 323/226, 229, 323/282–284, 288
See application file for complete search history.

(56) References Cited

U.S. PATENT DOCUMENTS

| | | | | |
|---|---|---|---|---|
| 3,783,387 | A | * | 1/1974 | Wernli ........................ 455/212 |
| 4,367,421 | A | * | 1/1983 | Baker .......................... 327/432 |
| 4,385,245 | A | | 5/1983 | Ulmer |
| 4,459,498 | A | * | 7/1984 | Stengl et al. .................. 327/436 |
| 4,727,465 | A | * | 2/1988 | Cini et al. ...................... 363/24 |
| 4,900,955 | A | * | 2/1990 | Kurpan ......................... 327/306 |
| 6,285,235 | B1 | | 9/2001 | Ichikawa et al. |
| 7,609,036 | B2 | * | 10/2009 | Bartolo et al. ................. 323/224 |
| 8,222,928 | B2 | | 7/2012 | Bayerer |
| 2005/0012541 | A1 | | 1/2005 | Watanabe |
| 2009/0140791 | A1 | | 6/2009 | Young |
| 2009/0316441 | A1 | | 12/2009 | Hu |
| 2010/0134179 | A1 | | 6/2010 | Bayerer |
| 2010/0327947 | A1 | | 12/2010 | Havanur |
| 2012/0044014 | A1 | | 2/2012 | Stratakos et al. |
| 2012/0139589 | A1 | | 6/2012 | Machida et al. |
| 2013/0127017 | A1 | | 5/2013 | Seok |
| 2013/0194027 | A1 | | 8/2013 | Ivankovic |

(Continued)

OTHER PUBLICATIONS

Ilchmann, B, "CoolSET & CoolMOS Ultra Wide Input Range, HV-BIAS Supply for SMPS with ICE2B265 and SPA02NBO," Application Note, Mar. 2008, Version 1.1, Infineon Technologies AG, Munich Germany, 14 pages.

(Continued)

*Primary Examiner* — An Luu
(74) *Attorney, Agent, or Firm* — Slater & Matsil, L.L.P.

(57) ABSTRACT

In accordance with an embodiment, a circuit includes a first transistor, a second transistor having a reference node coupled to an output node of the first transistor, and a control circuit. The control circuit is configured to couple a second reference node to a control terminal of the second transistor during a first mode of operation, couple a floating reference voltage between the control terminal of the second transistor and the reference terminal of the second transistor during a second mode of operation and during a third mode of operation, and couple a third reference node to the reference terminal of the second transistor during the third mode of operation. The second reference node is configured to have a voltage potential operable to turn-on the second transistor, and the floating reference voltage is operable to turn on the second transistor.

25 Claims, 13 Drawing Sheets

(56) References Cited

U.S. PATENT DOCUMENTS

2014/0118057 A1 5/2014 Ivankovic
2014/0167634 A1 6/2014 Ivankovic et al.

OTHER PUBLICATIONS

Mino, K. et al., "A Gate Drive Circuit for Silicon Carbide JFET," Swiss Federal Institute of Technology (ETH) Zurich, Power Electronic System Laboratory, Nov. 2-6, 2003, 5 pgs.

* cited by examiner

SYSTEM AND METHOD FOR DRIVING TRANSISTORS

TECHNICAL FIELD

The present invention relates generally to electronic circuits, and more particularly to a system and method for driving transistors.

BACKGROUND

Power supply systems are pervasive in many electronic applications from computers to automobiles. Generally, voltages within a power supply system are generated by performing a DC-DC, DC-AC, and/or AC-DC conversion by operating a switch loaded with an inductor or transformer. One class of such systems includes switched mode power supplies (SMPS). An SMPS is usually more efficient than other types of power conversion systems because power conversion is performed by controlled charging and discharging of the inductor or transformer and reduces energy lost due to power dissipation across resistive voltage drops.

Specific topologies for SMPS comprise buck-boost converters and flyback converters, among others. A buck-boost converter typically makes use of an inductor whereas a flyback converter isolates a load and may multiply the voltage conversion ratio through the use of a transformer. In addition to the energy storage element (either inductor or transformer), the operation of the switch is of particular importance, especially in high voltage applications.

One issue that arises with respect to operating semiconductor switches in high voltage environments is avoiding device destruction due to high voltages being applied to the semiconductor switch. Some systems rely on using devices that are specifically designed to withstand high bus voltages encountered in high voltage power supplies. However, even when high voltage devices are used, some design challenges remain with respect to ensuring that devices in the power supply circuit are able to withstand high voltage transient conditions that may arise within the switched-mode power supply. For example, in some switched-mode power supplies, transient voltages within the power supply circuit may exceed the DC or quiescent bus voltages present within the power supply system.

SUMMARY OF THE INVENTION

In accordance with an embodiment, a circuit includes a first transistor and a second transistor, and a control circuit. The first transistor has a reference terminal coupled to a first reference node, and a control terminal configured to be coupled to a switch control signal, the second transistor has a reference terminal coupled to an output terminal of the first transistor and an output terminal configured to be coupled to a load, and the control circuit is coupled to a control terminal of the second transistor and to the reference terminal of the second transistor. The control circuit is configured to couple a second reference node to the control terminal of the second transistor during a first mode of operation, couple a floating reference voltage between the control terminal of the second transistor and the reference terminal of the second transistor during a second mode of operation and during a third mode of operation, and couple a third reference node to the reference terminal of the second transistor during the third mode of operation. The second reference node is configured to have a voltage potential operable to turn-on the second transistor, and the floating reference voltage is operable to turn on the second transistor.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely switch drivers that are used in switched mode power supply systems. Embodiments of the invention may also be applied to switch drivers in other electronic applications such as, but not limited to, solar inverters, telecommunication devices, servers and uninterruptible power supplies.

One approach to switching operation for high voltage applications is to use multiple switches to distribute a total voltage across the different switches. In particular, cascaded transistors (often MOSFETs, but other types may be used) are an option. Cascaded MOSFETs for SMPS comprise a power supply solution with multiple design challenges. Example design challenges include maintaining an effective voltage distribution across transistors as well as selecting transistors that can withstand the maximum voltages applied across the devices.

According to some embodiments, two transistors may be coupled to a transformer to form a SMPS. Control circuitry is configured to couple the first transistor to a control terminal of the second transistor. The control circuitry is configured to maintain the second transistor in a conducting state throughout switching operation as the first transistor turns on and off. In some embodiments, maintaining the second transistor in a conducting state throughout switching operation predictably defines the transient voltage distribution across the two transistors, such that blocking voltages of the two transistors may be defined such that a minimum blocking voltage needed for each transistor is less than a total voltage applied across the two transistors during normal switching operation.

Figure 1:
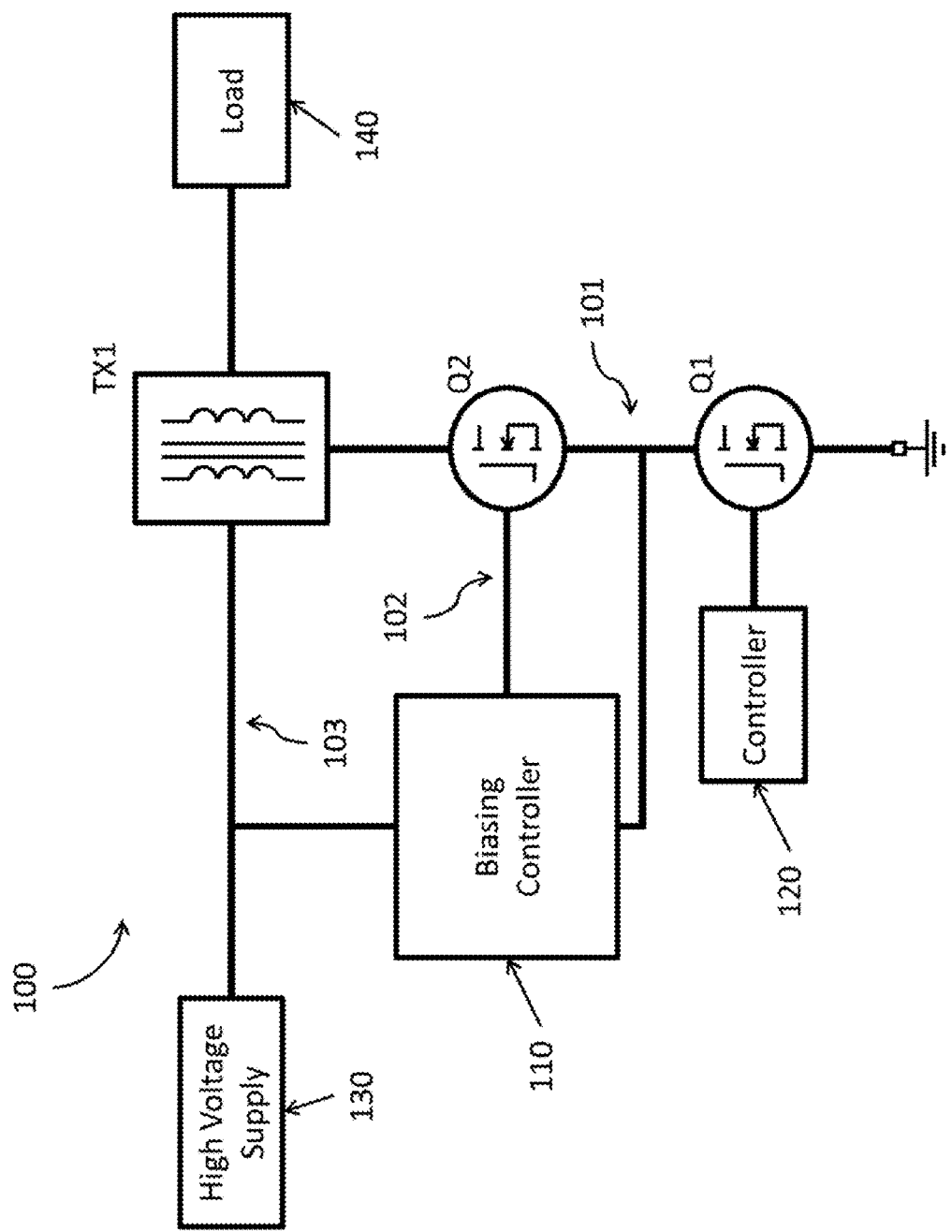
FIG. 1 illustrate a block diagram of an embodiment power supply.

In reference now to various embodiments, FIG. 1 illustrates a block diagram of power supply system 100, which includes a first transistor Q1 coupled to a second transistor Q2 through node 101, where node 101 is connected to an output terminal of transistor Q1 and a reference terminal of transistor Q2. It should be understood that the block diagram of FIG. 1 may be applied to other, more detailed embodiments described herein. Transistor Q1 and transistor Q2 are further coupled to charge biasing controller 110, also referred to as control circuit 110, through node 101 and node 102, where node 102 is connected to a control terminal of transistor Q2. Transistor Q1 receives a control signal on its control terminal from controller 120 that can be implemented, for example, using a conventional switched mode power supply (SMPS) controller and/or a pulse-width modulation (PWM) circuit in some embodiments. The power supply system 100 further comprises a high voltage supply 130 coupled to a transformer TX1 through high voltage bus 103. The charge biasing controller 110 is also connected to high voltage bus 103 in the embodiment shown. In another embodiment, the charge biasing controller 110 may be connected to a different reference node separate from the high voltage supply 130. In the illustrated embodiment, the secondary winding of transformer TX1 is coupled to load 140.

According to an embodiment, high voltage supply 130 is operated at a given reference voltage while transistors Q1 and Q2 are controlled to charge and discharge transformer TX1 in order to supply power to load 140. In some embodiments, controller 120 provides a pulse width modulated control signal and/or a frequency modulated control signal to maintain a constant voltage across load 140 via feedback control. Alternatively controller 120 may be configured to provide a constant current to load 140. According to an embodiment, controller 120 provides an output control signal that turns transistor Q1 on and off. Transistor Q2 is biased by biasing controller 110. Charge biasing controller 110 may be configured to keep transistor Q2 biased on even when transistor Q1 is turned off, and is configured to keep the gate of transistor Q2 charged even when Q1 is off. For example, transistor Q2 may be maintained in a linear operating region by biasing the gate-source voltage of Q2 to be at or above its threshold. In some embodiments, current though transistor Q2 is limited to maintain operation in the linear region. By biasing Q2 in the linear region when Q1 is off, Q2 may conduct large currents when transistor Q1 is turned on, by controller 120, with no delay or with very little delay. Other functions of controller 110 may include clamping the drain of transistor Q1 to high voltage bus 103 and/or another reference voltage to prevent the drain-source voltage of transistor Q1 from exceeding a rated voltage.

In some embodiments, biasing controller 110, or control circuit 110, is operated in three modes. Related to the three modes of operation, transistor Q1 receives a switch control signal from controller 120. During a first mode of operation, control circuit 110 is configured to couple the control terminal of transistor Q2 on node 102 to a reference node having a voltage potential operable to turn-on the second transistor Q2. In an embodiment, during the first mode of operation transistor Q1 is turned on by the switch control signal. During a second and third mode of operation, control circuit 110 is configured to couple a floating reference voltage between the control terminal of transistor Q2 on node 102 and the reference terminal of transistor Q2 on node 101. In an embodiment the floating reference voltage is operable to turn on transistor Q2 and may be implemented using a capacitor C20 as described in the following figures. During the second mode of operation transistor Q1 is turned off and a voltage at an output terminal of transistor Q2 is below a defined threshold. During the third mode of operation, control circuit 110 is configured to couple another reference node to the reference terminal of transistor Q2 on node 101. Also during the third mode of operation transistor Q1 is turned off and a voltage at the output terminal of transistor Q2 is above the defined threshold of the second mode of operation. According to an embodiment, the defined threshold may be about equal to a blocking voltage specification of transistor Q1.

In an embodiment, power supply system 100 is operated as a flyback converter in which an applied DC voltage on high voltage bus 103 is stepped up or stepped down to a voltage applied to load 140 according to the turns-ratio of transformer TX1. The applied voltage on high voltage bus 103 may be provided, for example, by a high voltage power supply 130. Examples of high voltage power supply 130 may include a rectified line voltage, an output of a high voltage battery, such as a battery used in electric and/or hybrid vehicles, or other types of high voltage power supplies.

Transistors Q1 and Q2 may be implemented, for example, by using power n-channel MOSFET transistors as shown. Alternatively, transistors Q1 and/or Q2 may be implemented, for example using IGBTs, other MOS transistor types, JFETs, and FET type transistors in general. In some embodiments current controlled transistors may be used with an additional impedance element included, such as a gate resistor with a bipolar junction transistor.

Figure 2:
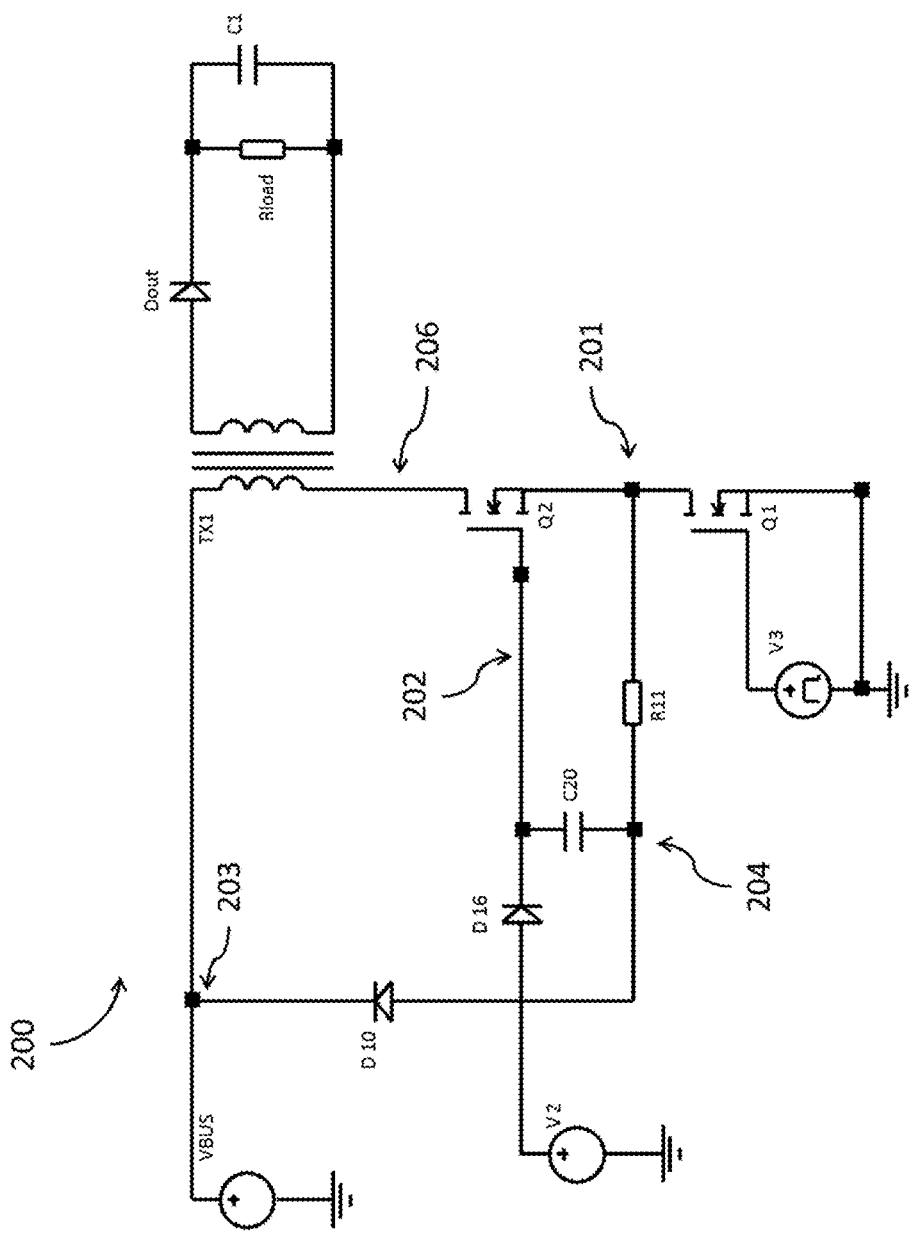
FIG. 2 illustrates a schematic of an embodiment power supply.

Referring now to FIG. 2, additional embodiments are depicted with more specific detail in power supply system 200. As shown, transistor Q1 is controlled by a voltage source V3. In some embodiments, voltage source V3 may be implemented using a switch driver or other circuit configured to turn Q1 on and off. In an embodiment, transistor Q1 is turned on and off via an activation signal and a deactivation signal. This switch driver may be incorporated, for example, as the output stage of a switched mode power supply controller or a PWM circuit. Such switch drivers may be implemented on a same integrated circuit as transistor Q1 or on a separate integrated circuit. In a specific embodiment, voltage source V3 includes a CoolSET® controller produced by Infineon.

In the embodiment shown in FIG. 2, a source of transistor Q2 is connected to node 201 and a gate of transistor Q2 is connected to node 202. The gate of transistor Q2 is coupled to the source of transistor Q2 via a resistor R11 and a capacitor C20, and reference voltage V2 is coupled to the gate of transistor Q2 via a diode D16. Diode D10 couples resistor R11 and capacitor C20 at a node 204 to a high voltage bus 203. A main voltage source VBUS supplies power to a primary winding of transformer TX1 via high voltage bus 203. In various embodiments, voltage source VBUS may include an AC or DC voltage supply of up to 800 Volts or higher than 800 Volts. In automotive embodiments, voltage source VBUS may be produced by a high voltage battery or stack of batteries. Alternatively, voltage source VBUS may represent other high voltage DC sources such as a rectified power line voltage.

With continued reference to FIG. 2, the primary winding of transformer TX1 is connected between transistor Q2 and high voltage bus 203 according to an embodiment. A secondary winding of transformer TX1 is connected to a load Rload through a diode Dout. The load Rload has a capacitor C1 connected in parallel. Diode Dout rectifies the current output by the secondary winding of transformer TX1, and capacitor C1 filters an output voltage across load Rload to reduce ripple on the output voltage.

Regarding the operation of power supply system 200 of FIG. 2, resistor R11 and capacitor C20 are configured to maintain transistor Q2 in a conducting state. In an embodiment, when transistor Q1 is turned off and is not conducting, resistor R11 and capacitor C20 maintains a bias voltage from a gate of transistor Q2 to a source of transistor Q2. In various embodiments, the biasing voltage may be equal to, less than, or greater than a threshold voltage of transistor Q2. In an embodiment, capacitor C20 samples a turn-on voltage between a control terminal of transistor Q2 on node 202 and a reference terminal of transistor Q2 on node 201. Voltage source V2 and diode D16 may be configured to maintain a charge on C20.

In an embodiment, the biasing voltage is applied to transistor Q2 as follows. When transistor Q1 is on, the voltage at the source of transistor Q2 is pulled close to ground, and the gate of transistor Q2 is coupled to reference voltage V2 via forward biased diode D16. Accordingly, the gate to source voltage of transistor Q2 is applied across the capacitor C20. When transistor Q1 turns off, however, the gate to source voltage across transistor Q2 is maintained across capacitor C20. In some power supply embodiments, for example, the flyback converter embodiment depicted in FIG. 2, the voltage at node 206 increases due to the inductance of the primary winding of transformer TX1. As such, the voltage at the source of transistor Q2 (node 201) increases and the voltage at the gate of transistor Q2 (node 202) increases as well. Once the voltage at the gate of transistor Q2 reverse biases diode D16, the gate source voltage of transistor Q2 is effectively sampled across capacitor C20. Accordingly, the voltage at the gate and source of transistor Q2 may experience large voltage transients without shutting transistor Q2 off.

In some embodiments, the capacitance of capacitor C20 is chosen to be much greater than the gate capacitance of transistor Q2. For example, in one embodiment, the gate capacitance of transistor Q2 is between about 100 pF and about 1 nF, and the capacitance of capacitor C20 is chosen to be between about 10 nF and about 470 nF.

In an embodiment, while transistor Q1 is turned off, transistor Q2 operates in the linear region. A current flows through resistor R11 and diode D10 to high voltage bus 203 when transistor Q1 is off and the voltage on the drain of transistor Q2 (node 206) exceeds the voltage on high voltage bus 203 by a diode voltage drop, a resistor voltage drop across R11, and a drain to source voltage drop across transistor Q2. Alternatively, diode D10 may be coupled to a reference voltage other than voltage source VBUS. In accordance with an embodiment the reference voltage will determine an approximate blocking voltage across transistor Q1 and the blocking voltage of Q2 may be chosen to support a remaining voltage difference which may fluctuate due to transformer TX1. In some embodiments, the voltage distribution across transistor Q1 is well defined and subject mostly to a voltage drift of the reference voltage, thereby enabling the blocking voltage of transistor Q1 to be selected with high precision.

With continued reference to the power supply system 200 of FIG. 2, as soon as transistor Q1 turns on, in accordance with an embodiment, the current flowing through R11 switches direction and the diode D10 becomes reverse biased. At the same time, the voltage across the gate and source of transistor Q2, i.e. the voltage difference between node 202 and node 201, is charged to a voltage sampled by capacitor C20 while the voltage at the source of transistor Q2 at node 201 is pulled down by transistor Q1, thereby ensuring that transistor Q2 is fully conducting. In some embodiments, Q2 fully conducts the current drawn by transistor Q1 in a time frame that is effectively equivalent to a turn on time of transistor Q1.

In FIG. 2, embodiment switch control circuitry is shown in the context of a flyback switched-mode power supply. Generally, during the operation of a flyback converter, a switch coupled to node 206 of the primary winding of transformer TX1 is turned on, thereby charging the primary winding of transformer TX1. In the embodiment illustrated in FIG. 2, the switches are implemented using the series combination of transistors Q1 and Q2. While switches Q1 and Q2 are on, current increases through the primary winding of transformer TX1 due to the inductance of the primary winding. When transistor Q1 is turned off, node 206 increases in voltage due to the inductance of the primary winding.

In some embodiments, the voltage of node 206 may exceed the voltage of high-voltage bus 203. Once the voltage of node 206 exceeds the voltage of high-voltage bus 203 by a voltage equivalent to the sum of the forward bias voltage of diode D10, and the respective voltage drops across resistor R11 and the output resistance of transistor Q2, current conducts from the source of transistor Q2 back to the high-voltage bus 203 via resistor R11 and diode D10. In some embodiments, the resistance of resistor R11 is selected such that transistor Q2 remains in the linear region, and that a relatively small amount of current is conducted from the primary winding of transistor TX1 in comparison to when transistor Q1 is on. For example, in one embodiment, the resistance of resistor R11 is set to be about 10 kΩ in order to keep the current through resistor R11 in the range of between about 0.1 mA and about 2 mA. It should be understood, however, that in alternative embodiments of the present invention, different resistances may be selected for resistor R11 to yield different ranges of currents.

When resistor R11 and diode D10 are conducting current from the primary winding of transistor TX1 to high-voltage bus 203, node 204 is clamped at about one diode drop above the voltage of high-voltage bus 203. In an embodiment, clamping the voltage at node 204 effectively limits the maximum voltage across the drain and source of transistor Q1 to be at about the DC voltage of high-voltage bus 203. Moreover, the maximum voltage across the drain and source of transistor Q2 is reduced by about the voltage seen at node 201. In one example embodiment, the maximum voltage across the drain and source of transistor Q1 may be between about 70 V and about 800 V, and the maximum voltage excursion seen across the drain and source of transistor Q2 may be between about 200 V and about 500 V. In other example embodiments, the voltage across the drain and source of transistor Q2 may be less than the voltage across the drain and source of transistor Q1, or vice versa. By taking into account the maximum voltage across the drain and source of transistor Q1 and the maximum voltage excursion seen across the drain and source of transistor Q2, the blocking voltages of transistor Q1 and Q2 may be selected accordingly. In some embodiments, the blocking voltage needed for transistor Q1 and Q2 are less than the maximum voltage excursion seen at node 206 and ground.

When switch Q1 is turned off, energy stored in the primary winding of transformer TX1 is transferred to the secondary winding of transformer TX1. In an embodiment, current supplied from the secondary winding of transformer TX1 forward biases diode Dout, charging capacitor C1 and supplying load Rload. In accordance with an embodiment, while the transistors Q2 and Q1 are on and the primary winding of transformer TX1 is charging, diode Dout is reverse biased (not conducting) and capacitor C1 may be configured to supply a voltage to the load Rload while diode Dout prevents capacitor C1 from being discharged into the secondary winding of transformer TX1.

In an embodiment, resistor R11, capacitor C20, and the diode D10 also assist the power supply system 200 during a turn off event. In an embodiment where both transistor Q1 and transistor Q2 are fully conducting and transformer TX1 is charged, voltage source V3 may turn off transistor Q1. Once transistor Q1 is no longer conducting, resistor R11 and diode D10 provide a current path from node 201 to a reference voltage, maintaining node 201 at a substantially constant voltage. Current flows through resistor R11 and diode D10 once the voltage at the drain of transistor Q2 (node 206) exceeds the reference voltage. In the embodiment shown in FIG. 2, voltage source VBUS connected to high voltage bus 203 is configured to serve as the reference voltage.

Figure 3A:
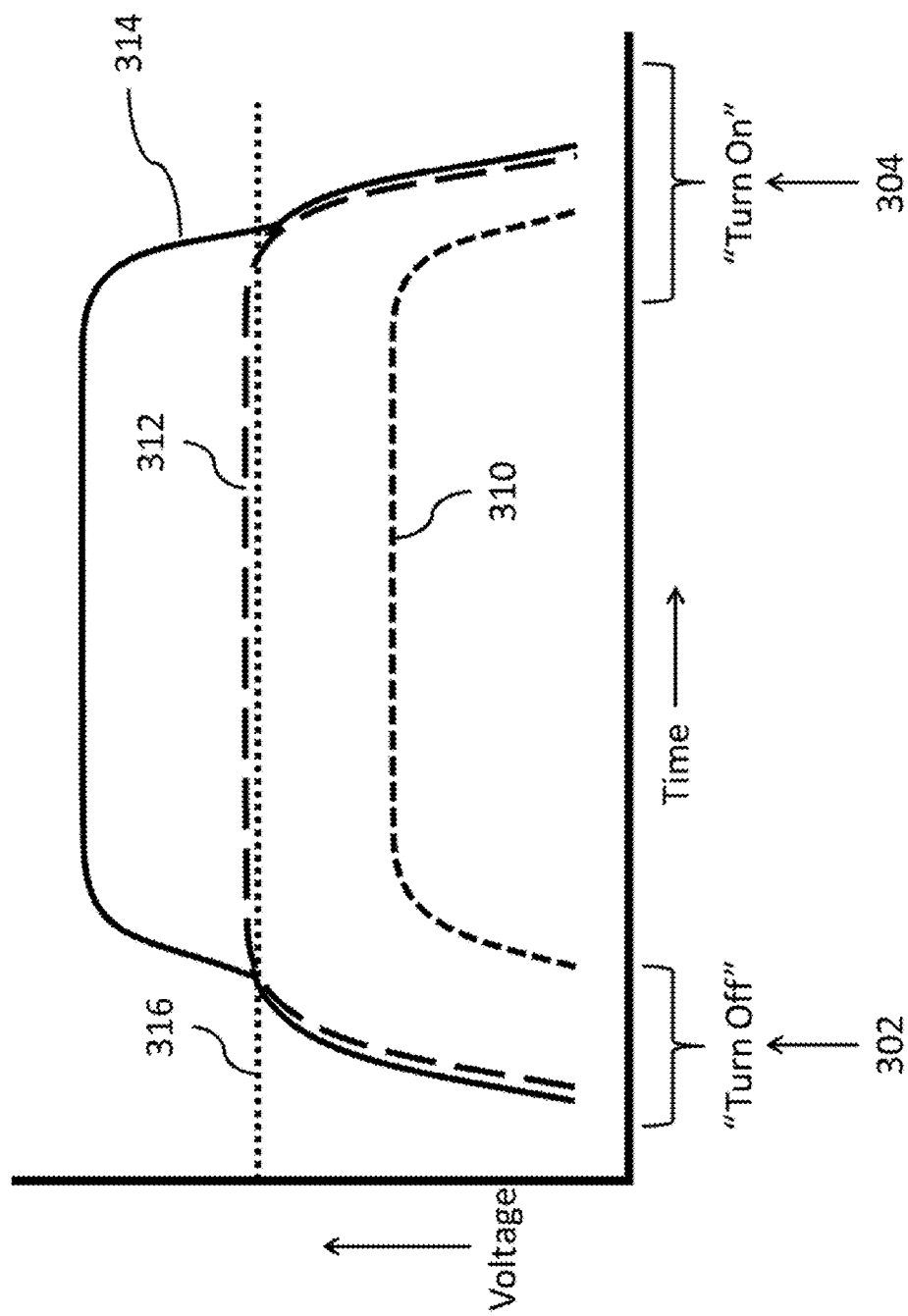
FIGS. 3a-c illustrate waveform diagrams of embodiment systems.
Figure 3B:
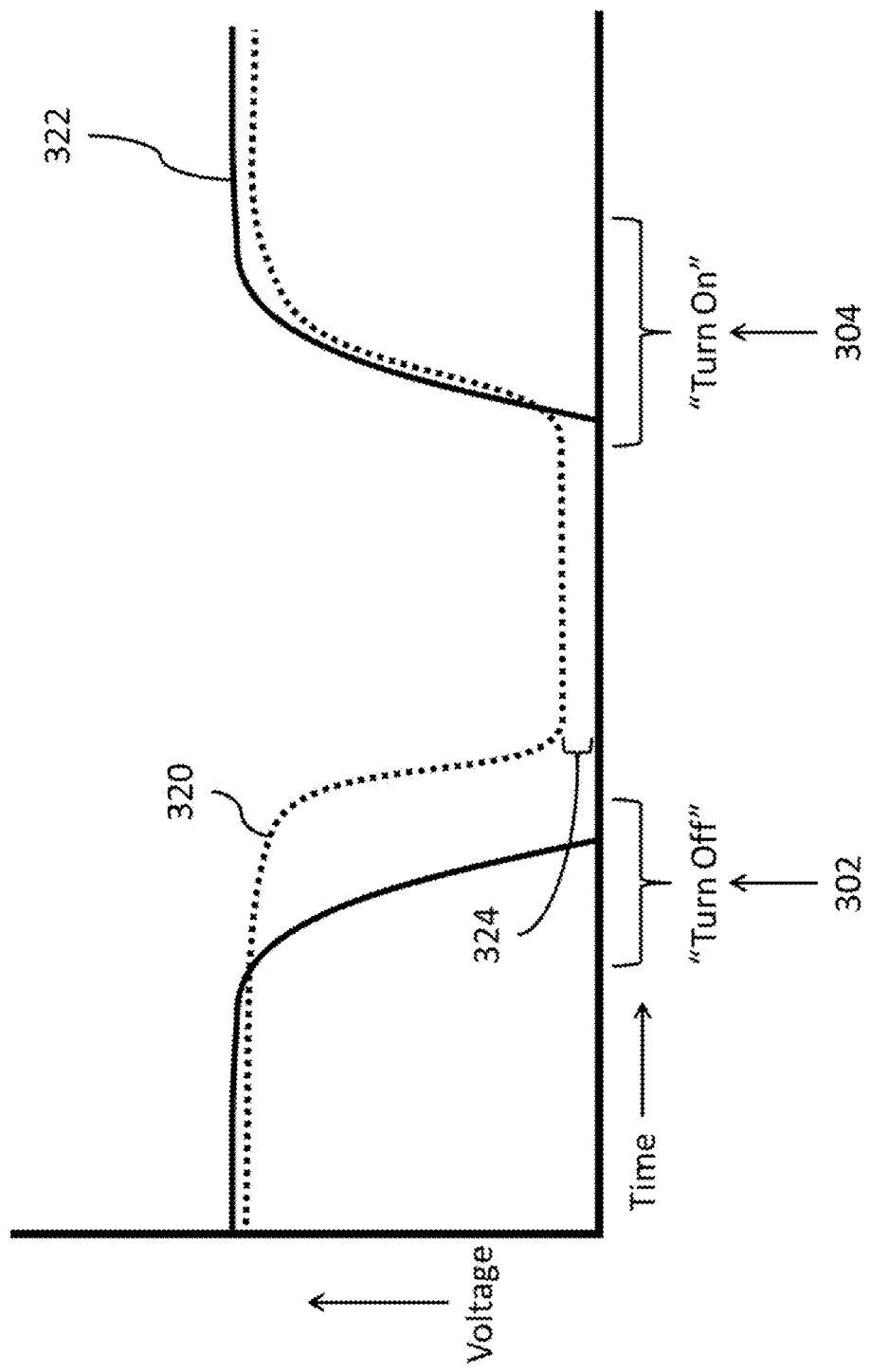
Figure 3C:
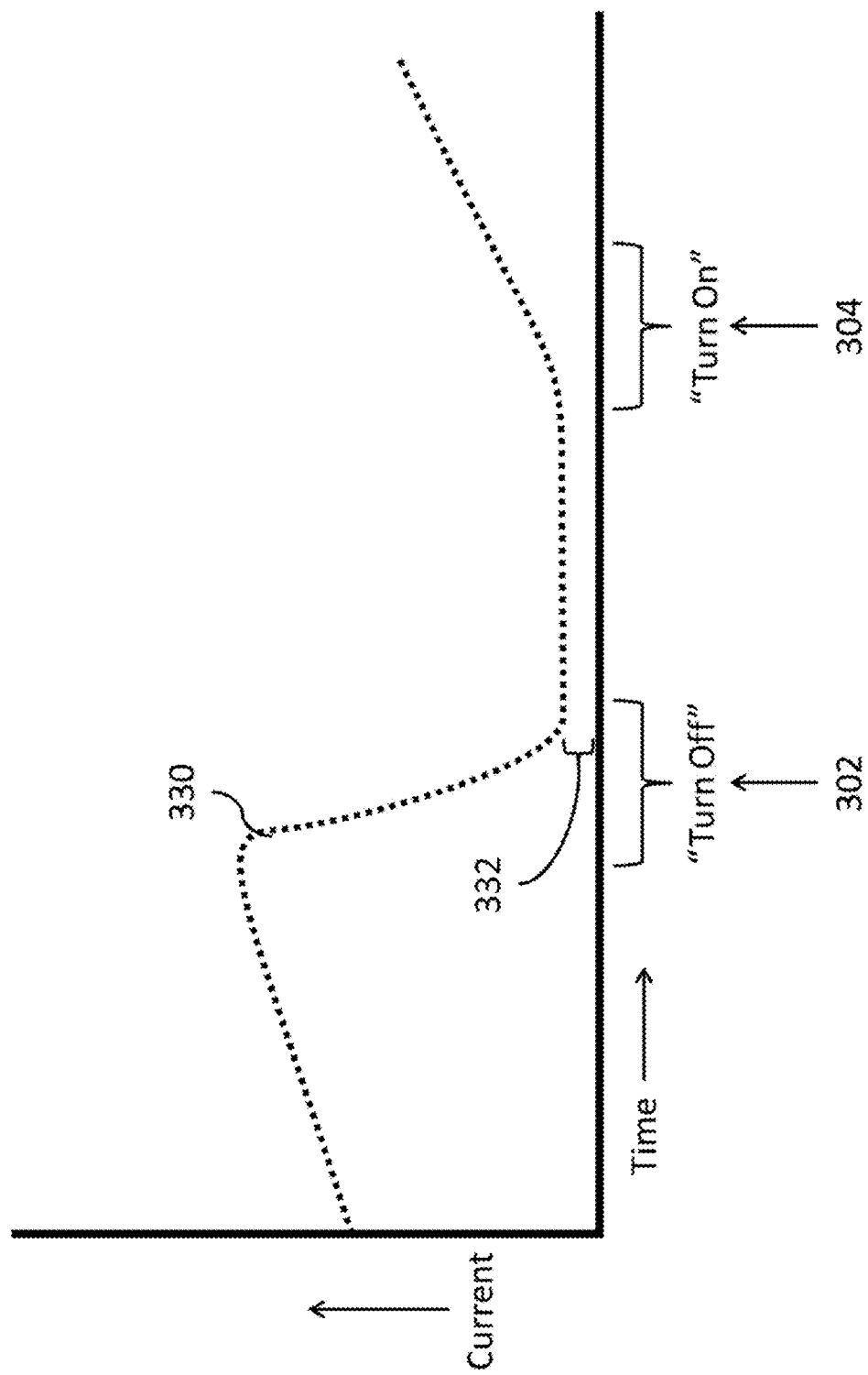

With reference now to FIGS. 3a-c, various illustrative plots are depicted. FIG. 3a illustrates an embodiment waveform plot showing the voltage distribution across transistors Q1 and Q2 versus time. Waveform 310 represents the drain-source voltage of transistor Q2 and waveform 312 represents the drain-source voltage of transistor Q1. Waveform 314 represents the voltage at node 206, which is the sum of drain-source voltage of transistor Q1 and drain-source voltage of transistor Q2. Region 302 depicts an operation time during which transistor Q1 is turning off and region 304 depicts an operation time during which transistor Q1 is turning on. Waveform 316 depicts a voltage on high voltage bus 203 as described above. Transistor Q1 drain-source voltage 312 is increased in region 302 until it is about equal to voltage 316 on high voltage bus 203. In various embodiments a maximum drain-source voltage 312 is about equal to, less than, or greater than voltage 316 of high voltage bus 203. Once drain-source voltage 312 reaches about voltage 316 of high voltage bus 203 in region 302, transistor Q2 drain-source voltage 310 increases. Drain-source voltage 310 of transistor Q2 may increase to about less than half of drain-source voltage 312 of transistor Q1, in some embodiments. Alternatively, drain-source voltage 310 of transistor Q2 may increase to be less than or greater than drain-source voltage 312 of transistor Q1. In an embodiment, the drain-source voltage 310 of transistor Q2 may be about voltage 316 of high voltage bus 203. In some embodiments, drain-source voltage 310 may be higher than drain-source voltage 312 and in some embodiments drain-source voltage 310 may be lower than drain-source voltage 312.

According to an embodiment, drain-source voltage 312 of transistor Q1 may be substantially constant once past turn-off region 302. Conversely, drain-source voltage 310 of transistor Q2 may fluctuate in response to a transformer TX1 as described previously. In an embodiment drain-source voltage 310 of transistor Q2 fluctuates, but remains less in magnitude than drain-source voltage 312, which is held effectively constant. During region 304 when transistor Q1 is turning on, both drain-source voltages 312 and 310 of transistors Q1 and Q2 decrease as a current through transistors Q1 and Q2 increases. A blocking voltage specification for each transistor Q1 and Q2 may be determined by the respective maximum drain-source voltages 312 and 310. In some embodiments, the maximum blocking voltage for each device is less than a maximum output voltage of the power supply system. It should be understood that all plots are not drawn to scale and should be understood purely as illustrative embodiments of circuit operation.

FIG. 3b illustrates a waveform diagram illustrating gate-source voltage 322 of transistor Q1 and gate-source voltage 320 of transistor Q2. The time during which transistor Q1 turns off is denoted as region 302, and the time during which transistor Q1 turns on is denoted as region 304. As shown, during turn off region 302 gate-source voltage 322 of transistor Q1 decreases to about zero or near zero, thereby turning transistor Q1 off. During region 302, gate-source voltage 320 of transistor Q2 also may decrease to about the threshold voltage of transistor Q2 in some embodiments, as depicted by voltage level 324. Maintaining gate voltage 320 at or near about a threshold voltage causes transistor Q2 to be biased at least in the linear region.

During turn on region 304, gate-source voltage 322 increases, turning transistor Q1 back on and causing transistor Q1 to begin conducting again. In the embodiment shown, gate-source voltage 320 increases with nearly no delay because transistor Q2 is biased in the linear region and is not completely shut off. Thus, transistor Q2 immediately conducts higher current following the turn-on of transistor Q1. It should be understood that all plots are not drawn to scale and should be understood purely as illustrative embodiments of circuit operation.

FIG. 3c illustrates a waveform diagram depicting an embodiment drain current 330 through transistor Q2. As shown, the transistor Q2 drain current 330 increases when transistor Q1 and transistor Q2 are turned on. During turn off region 302, drain current 330 decreases quickly because transistor Q1 is no longer conducting and the path to ground is disconnected. Drain current 330 decreases down to about a current level 332. In various embodiments, current level 332 will range, but may remain greater than zero. Current level 332 may be equal to a current flowing through transistor Q2 while it is operating in the linear region. Once transistor Q1 is turned back on in region 304, drain current 330 begins increasing again. Drain current 330 may increase in an approximately linear fashion within a certain range.

Figure 4:
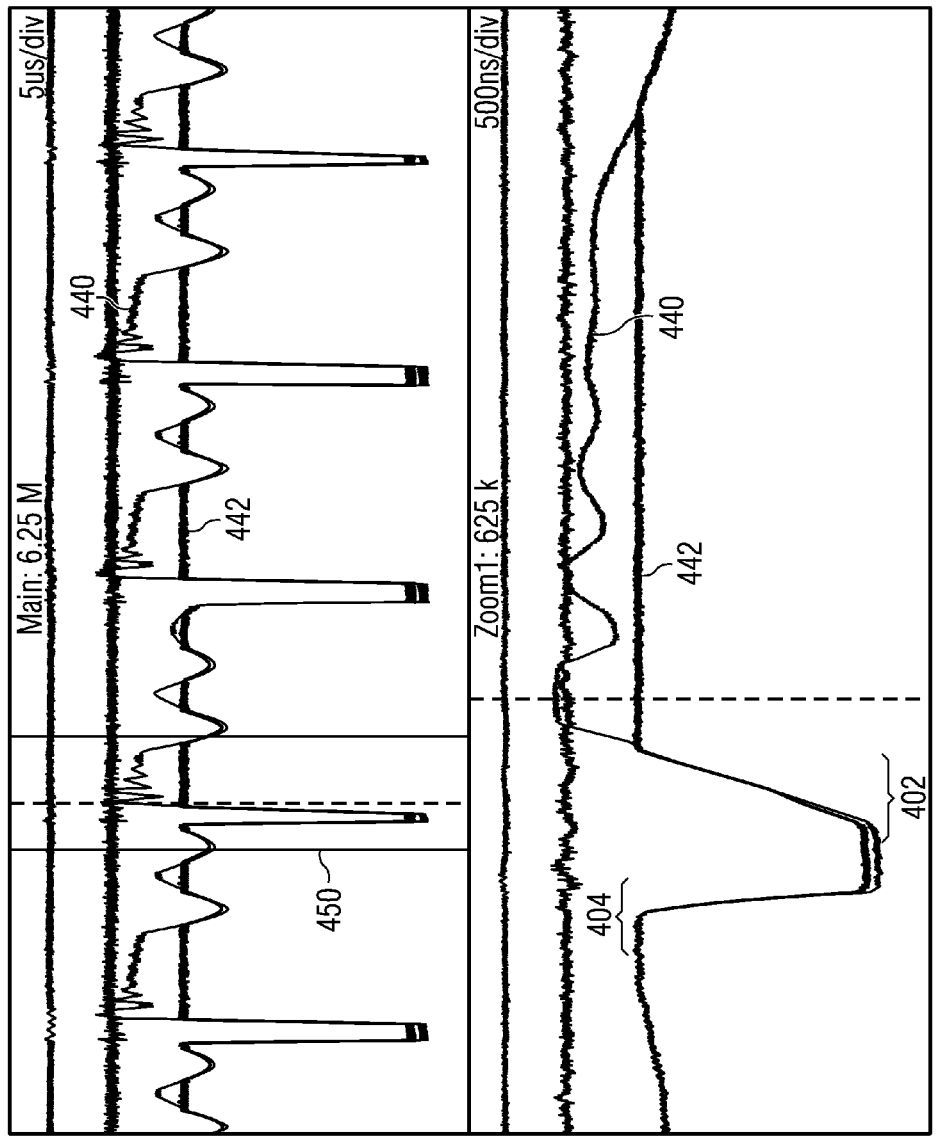
FIG. 4 illustrates a waveform diagram of an embodiment system.

FIG. 4 illustrates a waveform diagram depicting an embodiment voltage plot of transistor Q1 drain voltage 442 and transistor Q2 drain voltage 440. The top plot depicts periodic turn-on and turn-off behavior and the bottom plot shows an expanded view of cut-away 450. During a turn on region 402, the drain voltages 440 and 442 decrease as both transistors Q1 and Q2 conduct current to a ground node. During a turn off region 402, the drain voltages 440 and 442 increase as transistor Q1 turns off and stops conducting current to a ground node. According to the embodiment shown, transistor Q1 drain voltage 442 increases to about 800 volts and then remains about constant. Simultaneously, transistor Q2 drain voltage 440 increases above 800 V to a maximum of about 1100 volts as shown.

Because the drain of transistor Q1 is connected to the source of transistor Q2 as described with reference to FIGS. 1-2, a maximum drain-source voltage across transistor Q2 will be the difference between transistor Q2 drain voltage 440 and transistor Q1 drain voltage 442. In the embodiment shown, the drain-source voltage across transistor Q2 is about 300 volts. Therefore a transistor having a blocking voltage specification of at least about 300 volts may be selected for transistor Q2. Transistor Q1 also sustains a drain-source voltage equal to about transistor Q1 drain voltage 442, or about 800 volts. Therefore a transistor having a blocking voltage specification of at least about 800 volts may be selected for transistor Q1. As shown in FIG. 4 and in accordance with an embodiment, the drain-source voltages across transistors Q1 and Q2 are well characterized, predictable, and distributed.

Figure 5:
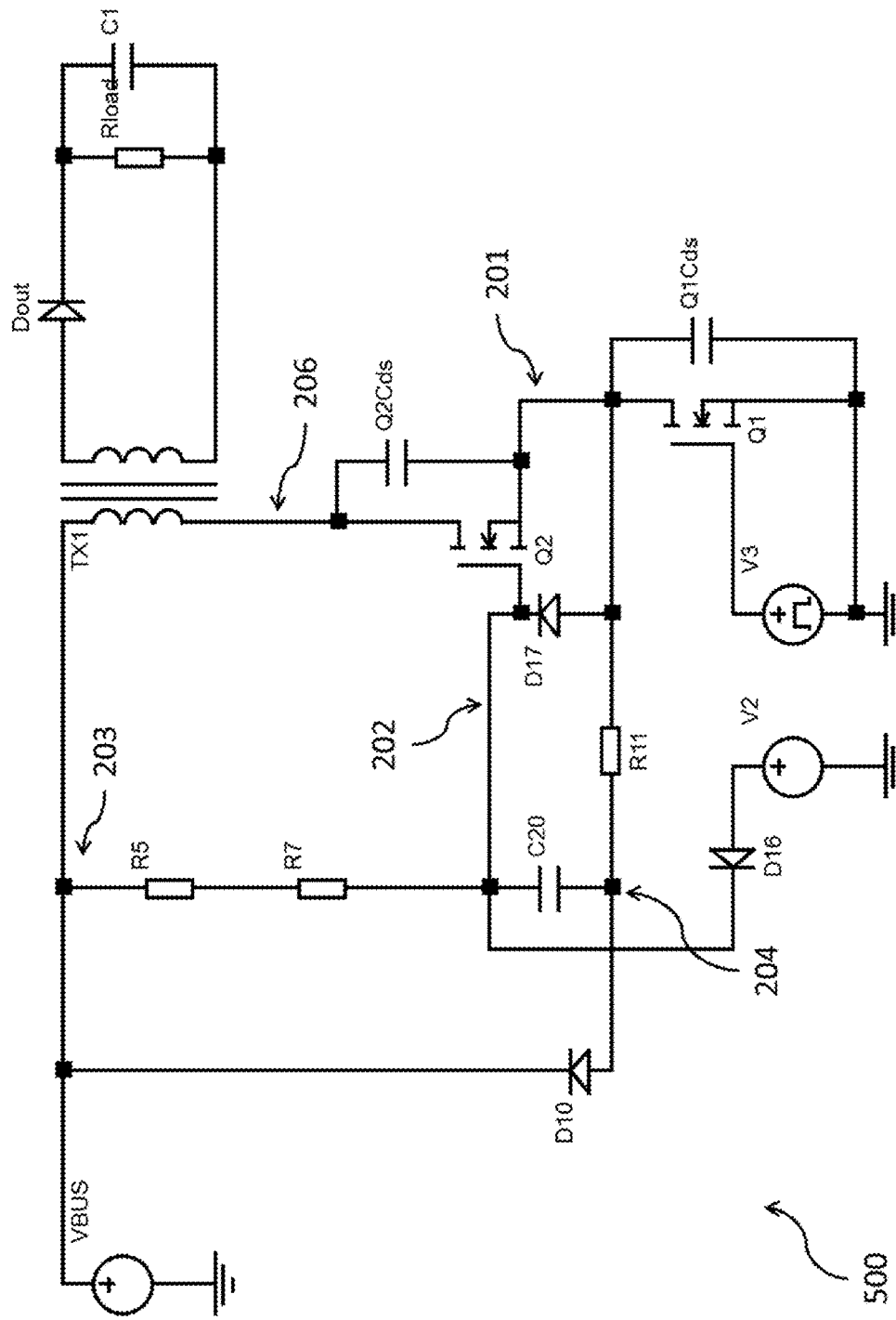
FIG. 5 illustrates a schematic of an embodiment power supply.

Referring now to a more detailed embodiment depicted in FIG. 5, a power supply system 500 contains all the elements as described with reference to FIG. 2, as well as additional elements. As shown, node 202 on the gate of transistor Q2 is coupled to high voltage bus 203 via resistor R7 in series with resistor R5, and node 202 is also coupled to node 201 on the drain of transistor Q1 via a diode D17. Drain to source parasitic capacitances Q2Cds and Q1Cds are shown across the drain and source of transistor Q2 and transistor Q1, respectively.

Resistor R5 and resistor R7 charge capacitor C20 in an embodiment during start-up when capacitor C20 is fully discharged; thereby ensuring that capacitor C20 is initially charged to a sufficient voltage to turn-on transistor Q2. According to various embodiments, resistors R5 and R7 are large, may have a total resistance in a megaohm range, and may have a total resistance of about 4 megaohms. In an alternative embodiment, a single resistor coupled between VBUS and the gate of transistor Q2 may be used if the rating of the single resistor is sufficient to withstand the high voltages of the system. In other embodiments, the number of resistors coupled in series may depend on the voltage ratings of the particular resistors used.

Diode D17 is a protection diode that helps maintain a biasing voltage on the gate of transistor Q2. In reference to a high voltage embodiment, stray capacitances within the circuit of power system 500 may cause slight voltage fluctuations during turn on and turn off transient times. Because a small stray capacitance on a high voltage node of about 800 volts, such as node 201, can cause fluctuations as much as about 10 volts, diode D17 will prevent a negative voltage from developing across the gate and source of transistor Q2 during turn on and turn off transients, according to an embodiment. In a particular embodiment, transistor Q2 gate and source reference voltage switches from ground when transistor Q1 is conducting to about high voltage bus 203 when transistor Q1 is not conducting. Diode D17 may prevent stray capacitance within the circuit to cause the gate-source voltage of transistor Q2 to be negative in the presence of large voltage swings. Capacitors Q1Cds and Q2Cds represent the parasitic drain-source capacitance of transistors Q1 and Q2.

Figure 6:
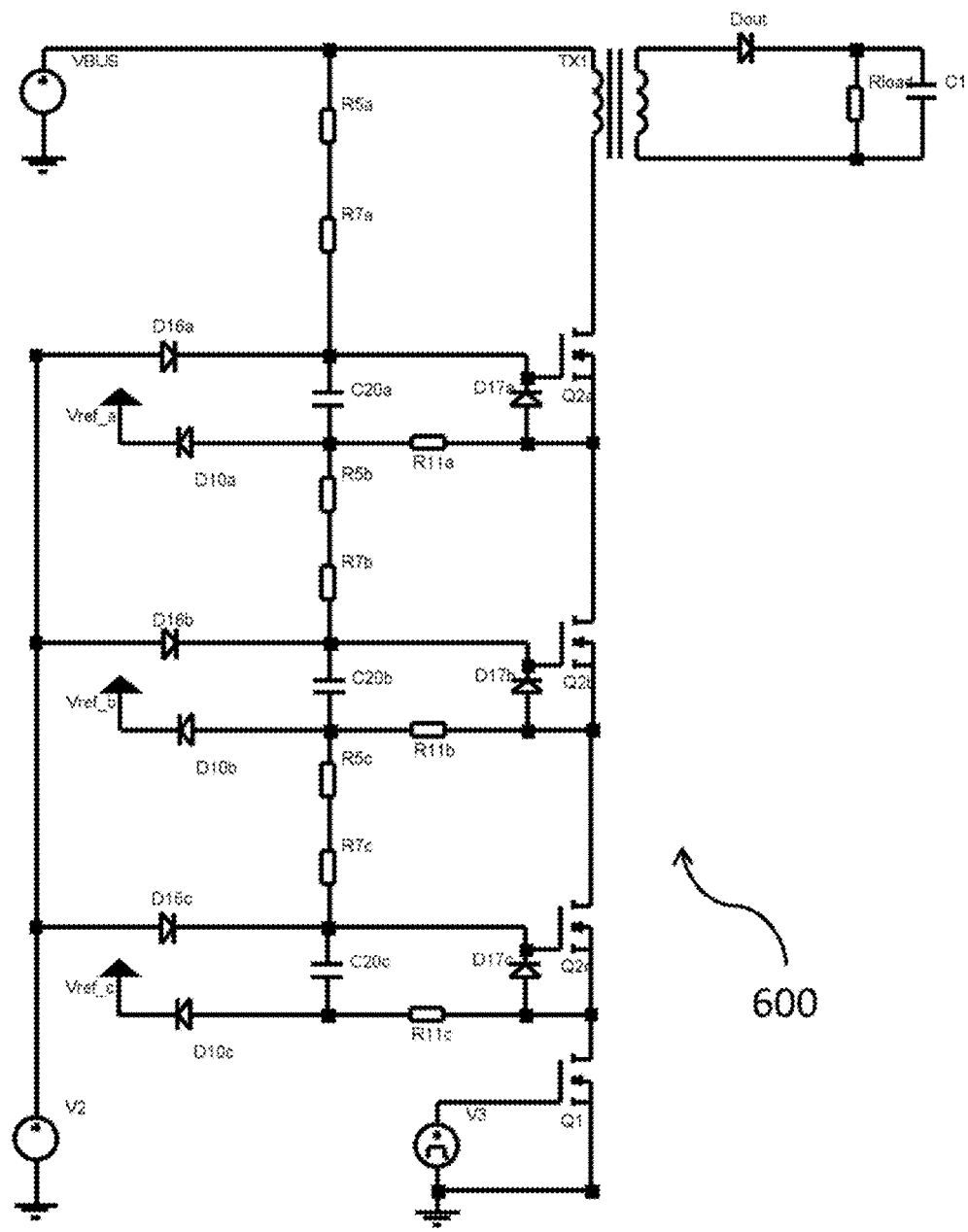
FIG. 6 illustrates a schematic of an embodiment power supply having more than two transistors.

With reference now to an embodiment depicted in FIG. 6, power supply system 600 may include more than two transistors. As shown, a circuit as described earlier and including primarily transistor Q2, resistor R11, capacitor C20, and diode D10, may be replicated a number of times. In the embodiment shown, each circuit repetition maintains consistent component numbers with the addition of an 'a', 'b', or 'c' suffix. Transistor Q1 controlled by voltage source V3 is connected to a source of the final transistor Q2c, as shown. Diodes D10a-c now couple resistor R11a-c to respective reference nodes Vref_a-c. In an embodiment, voltage VBUS has a voltage that is greater than a voltage at node Vref_a, which is greater than a voltage at node Vref_b, which is greater than a voltage at Vref_c. It should be understood that greater or fewer transistors and the accompanying circuitry depicted could be used in various embodiments and remain within the scope of this disclosure.

Figure 7:
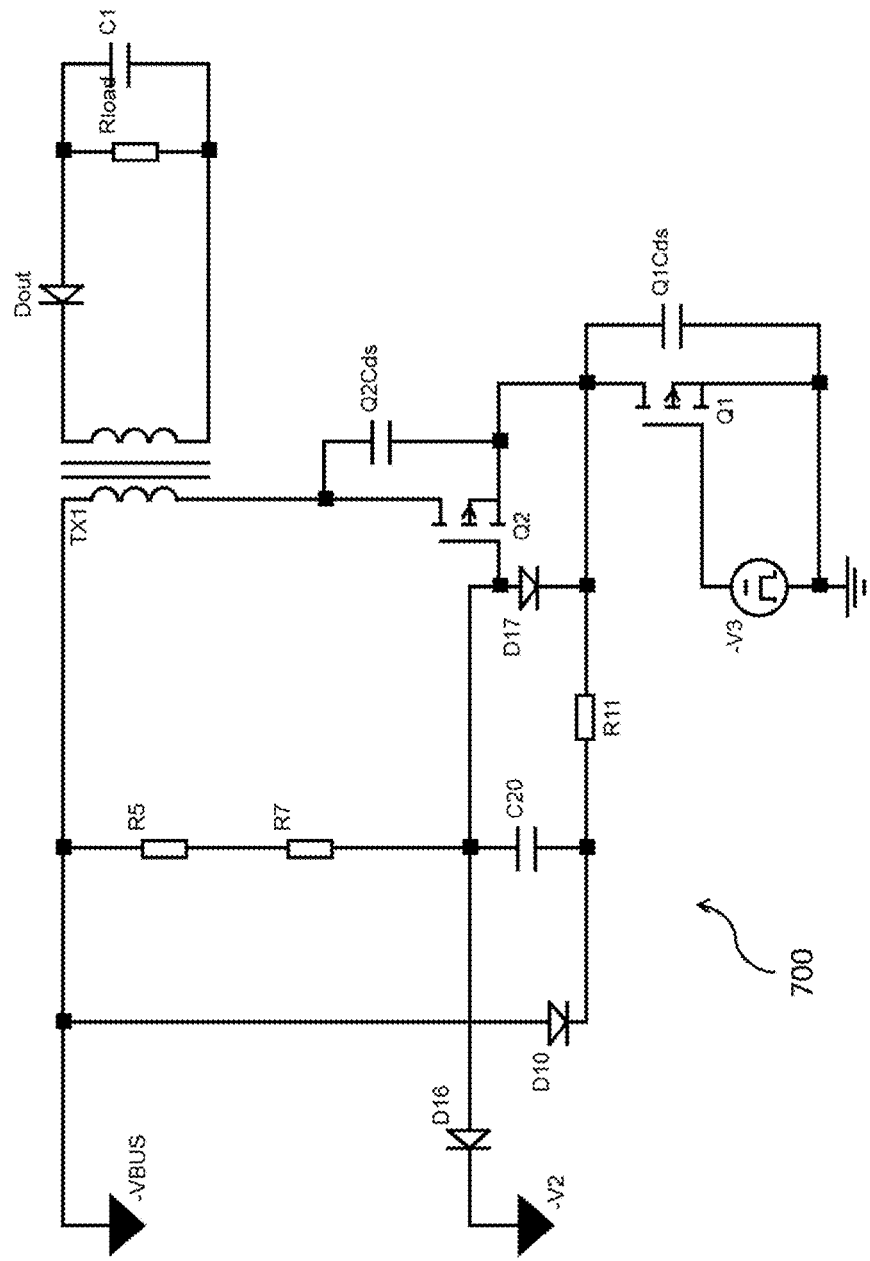
FIG. 7 illustrates a schematic of another embodiment power supply.

FIG. 7 depicts an embodiment power supply system 700 using P-type transistors Q1 and Q2. As described with reference to the previous figures, power supply system 700 may operate in a similar manner with the exception that various polarities are generally reversed. In accordance with the embodiment shown, transistor Q2 and transistor Q1 are PFETs, voltage source—V3, voltage source—V2, and voltage source—VBUS are negative sources, and diodes D10, D16, D17, and Dout are reversed. As shown, the source of transistor Q1 is coupled to ground and all reference voltage sources are negative. In alternative embodiments, Q1 may be referenced to a first node other than ground, in which case, the reference voltage sources are configured to output voltages that are less than the voltage at the first node.

Figure 8A:
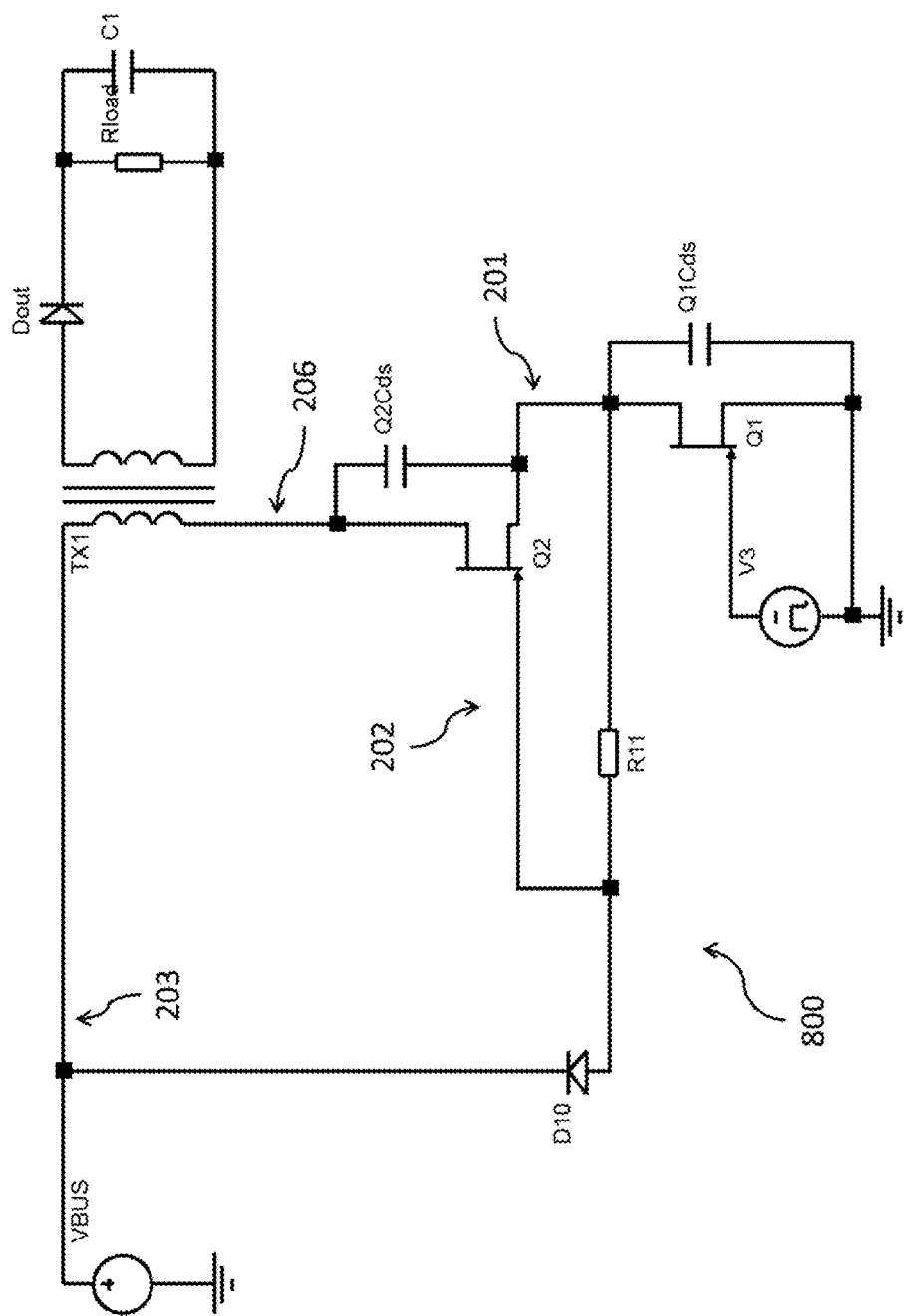
FIGS. 8a-b illustrate schematics of further embodiment power supplies.

According to an embodiment depicted in FIG. 8a, power supply system 800 transistor Q2 and transistor Q1 may be implemented using JFETs. In the embodiment shown, the power supply system 800 may be simplified compared to other embodiments described previously with reference to FIGS. 1-7. Specifically, resistor R11 may couple the gate of transistor Q2 on node 202 directly to the source of transistor Q2 on node 201, eliminating the need for a supply reference voltage and diode, a protection diode, and capacitor to be coupled to node 202 in various embodiments. In an embodiment, voltage source V3 may supply a negative control voltage signal. In other embodiments, a fast Zener diode may be used as a protection diode on the gate of transistor Q2.

Figure 8B:
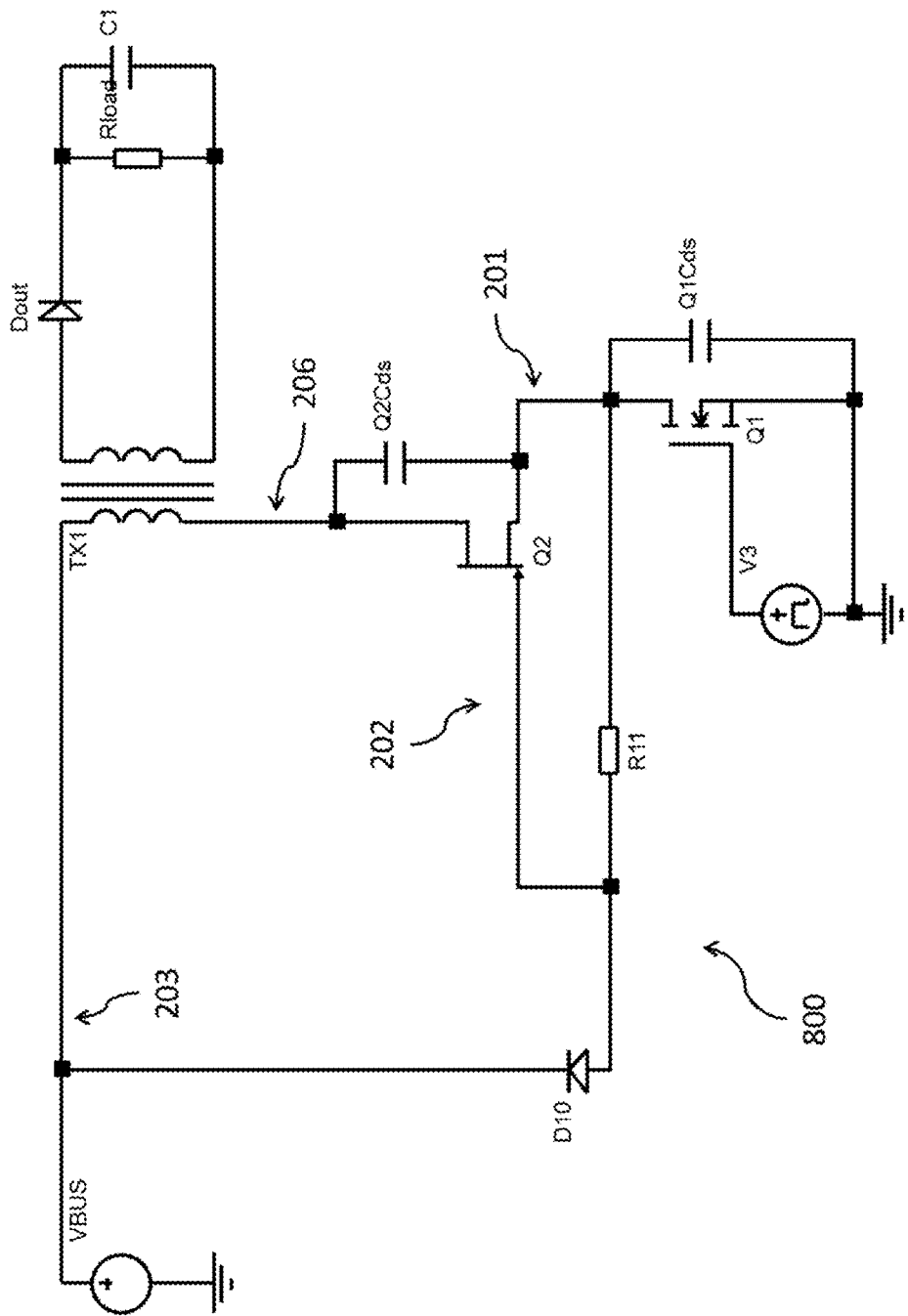

In another embodiment, as depicted in FIG. 8b, transistor Q1 may be implemented using a switch transistor, such as a MOSFET, while transistor Q2 is implemented using a normally on transistor, such as a JFET. In alternative embodiments, normally on transistors may also include, for example, a Gallium Nitride (GaN) transistor, a SOiC JFET, or a depletion mode silicon MOSFET transistor, such as a depletion mode NMOS device. Switch transistors may also include, for example an enhancement mode MOS device, an NMOS device, a PMOS device, a BJT or an IGBT. Voltage source V3 may provide a positive or negative control voltage to transistor Q1 according to various embodiments. Transistor Q2 may be a silicon carbide (SiC) type JFET and may have a large blocking voltage rating. In an embodiment, resistor R11 and diode D10 provide a voltage signal to the gate and source of transistor Q2 to maintain transistor Q2 in a conducting state during various modes of operation.

Figure 9:
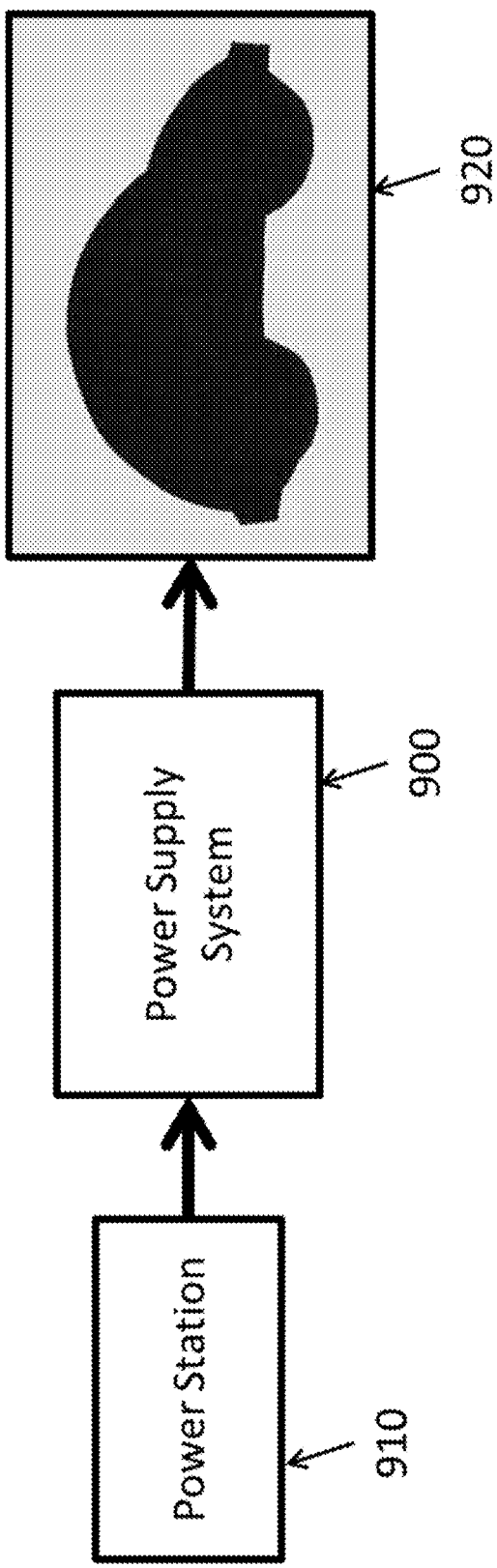
FIG. 9 illustrates a block diagram of a system that utilizes an embodiment power supply.

FIG. 9 depicts an embodiment system 900 for charging a battery for an electric vehicle. In accordance with embodiments described previously in FIGS. 1-8, power supply system 900 is connected between a voltage supply 910 and an electric vehicle 920 to form a high voltage battery charging system. In various embodiments, voltage supply 910 may include home charging systems, power charging stations, power outlets, AC or DC supplies, and any combination thereof. Electric vehicle 920 may include any type of vehicle containing a rechargeable battery. It should be further understood that this is a mere embodiment usage and power supply system 900 may be incorporated into any voltage supply system for any type of application relevant to a system and method for operating a transistor.

Figure 10:
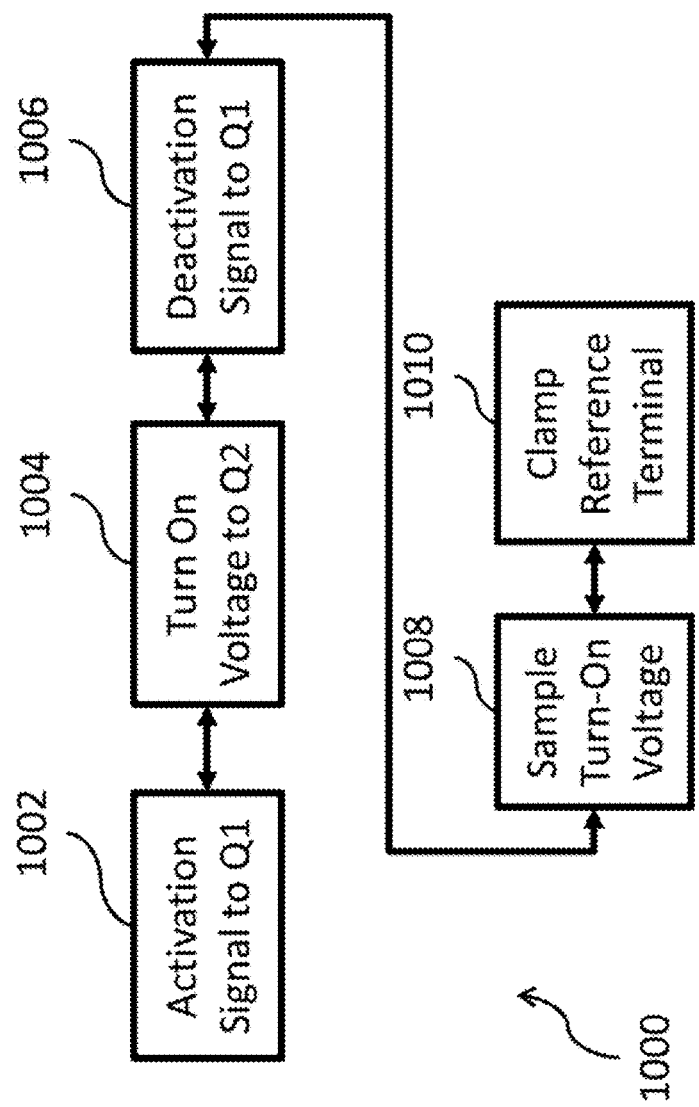
FIG. 10 illustrates a flowchart of an embodiment method of operation.

FIG. 10 illustrates an embodiment method of operation 1000 of using a first transistor Q1 having a reference terminal coupled to a first reference voltage, and a control terminal configured to be coupled to a switch control signal, and a second transistor Q2 having a reference terminal coupled to an output terminal of the first transistor Q1 and an output terminal configured to be coupled to a load. The method of operation 1000 includes step 1002 of turning on the first transistor Q1 by applying an activation signal to the control terminal of the first transistor Q1. Step 1004 includes applying a turn-on voltage between a control terminal of the second transistor Q2 and the reference terminal of the second transistor Q2, wherein the turn-on voltage biases the second transistor Q2 in an on-state. Step 1006 includes turning off the first transistor Q1 by applying a deactivation signal to the control terminal of the first transistor Q1. Step 1008 includes sampling the turn-on voltage between the control terminal of the second transistor Q2 and the reference terminal of the second transistor Q2. Step 1010 includes clamping the reference terminal of the second transistor Q2 to a third reference voltage when a voltage at the output terminal of the second transistor Q2 exceeds the third reference voltage.

In accordance with an embodiment, a circuit includes a first transistor and a second transistor, and a control circuit. The first transistor has a reference terminal coupled to a first reference node, and a control terminal configured to be coupled to a switch control signal, the second transistor has a reference terminal coupled to an output terminal of the first transistor and an output terminal configured to be coupled to a load, and the control circuit is coupled to a control terminal of the second transistor and to the reference terminal of the second transistor. The control circuit is configured to couple a second reference node to the control terminal of the second transistor during a first mode of operation, couple a floating reference voltage between the control terminal of the second transistor and the reference terminal of the second transistor during a second mode of operation and during a third mode of operation, and couple a third reference node to the reference terminal of the second transistor during the third mode of operation. The second reference node is configured to have a voltage potential operable to turn-on the second transistor, and the floating reference voltage is operable to turn on the second transistor.

In an embodiment, the first reference node is a ground node and a voltage difference between the third reference node and the ground node is configured to be greater than a voltage difference between the second reference node and the ground node. The first transistor may include a first n-channel MOSFET transistor and the second transistor may include a second n-channel MOSFET transistor.

In an embodiment, the control circuit is further configured to bias the second n-channel MOSFET transistor in a linear region during the second and third mode of operation. In some embodiments, the control circuit includes a capacitor having a first terminal coupled to the control terminal of the second transistor and a first resistor coupled between the reference terminal of the second transistor and a second terminal of the capacitor. The control circuit may further include a first diode coupled between the second reference node and the control terminal of the second transistor, and a second diode coupled between the second terminal of the capacitor and the third reference node. In some embodiments, the control circuit is further configured to provide a current path from the reference terminal of the second transistor to the second reference node during the third mode of operation. The circuit may further include a transformer having a first winding coupled between the third reference node and the output terminal of the second transistor.

In an embodiment, the first transistor is on during the first mode of operation, the first transistor is off and a voltage at the output terminal of the second transistor is below a first threshold during the second mode of operation, and the first transistor is off and a voltage at the output terminal of the second transistor is above the first threshold during the third mode of operation.

In accordance with another embodiment, a method of operating includes turning on the first transistor by applying an activation signal to a control terminal of a first transistor, applying a turn-on voltage between a control terminal of a second transistor and a reference terminal of the second transistor, such that the turn-on voltage biases the second transistor in an on-state, turning off the first transistor by applying a deactivation signal to the control terminal of the first transistor, sampling the turn-on voltage between the control terminal of the second transistor and the reference terminal of the second transistor, and clamping the reference terminal of the second transistor to a third reference voltage when a voltage at the output terminal of the second transistor exceeds the third reference voltage. The first transistor has a reference terminal coupled to a first reference voltage, and a control terminal configured to be coupled to a switch control signal. The reference terminal of the second transistor is coupled to an output terminal of the first transistor and an output terminal of the second transistor is configured to be coupled to a load.

In an embodiment, clamping further includes limiting current through the second transistor when the voltage at the output terminal of the second transistor exceeds the third reference voltage. Clamping may further include forward biasing a diode coupled between the third reference voltage and the reference terminal of the second transistor, and limiting current though the second transistor may include limiting current though a resistor coupled between the reference terminal of the second transistor and the third reference voltage.

In an embodiment, applying the turn-on voltage further includes coupling a second reference voltage to the control terminal of the second transistor, and sampling the turn-on voltage further includes decoupling the second reference voltage from the control terminal of the second transistor. The turn-on voltage may be sampled on a capacitor coupled between the control terminal of the second transistor and the reference terminal of the second transistor. In an embodiment, coupling the second reference voltage includes forward biasing a diode coupled between the second reference voltage and control terminal of the second transistor and decoupling the second reference voltage includes reverse biasing the diode coupled between the second reference voltage and the control terminal of the second transistor. The method may also include driving a winding of a transformer with the output terminal of the second transistor.

In accordance with a further embodiment, a circuit includes a first transistor and a second transistor. The first transistor has a reference terminal coupled to a first reference node and a control terminal configured to be coupled to a switch control signal. The second transistor has a reference terminal coupled to an output terminal of the first transistor and an output terminal configured to be coupled to a load terminal. The circuit further includes a first capacitor having a first terminal coupled to a control terminal of the second transistor and a second terminal coupled to the reference terminal of the second transistor, a first diode coupled between a second reference node and the control terminal of the second transistor, and a second diode coupled between a third reference node and the second terminal of the first capacitor.

In an embodiment, the circuit further includes a resistor coupled between the second terminal of the first capacitor and the reference terminal of the second transistor. The circuit may further includes a third transistor coupled between the output terminal of the second transistor and the load terminal, a second capacitor having a first terminal coupled to a control terminal of the third transistor, a second terminal coupled to a reference terminal of the third transistor, a fourth diode coupled between the second reference node and the control terminal of the third transistor, and a fifth diode coupled between a fourth reference node and the second terminal of the second capacitor.

In an embodiment, the circuit further includes a transformer having a first terminal of a winding coupled to the output terminal of the second transistor. In some cases, a second terminal of the first winding may be coupled to the third reference node.

In an embodiment, the first transistor comprises a first MOSFET and the second transistor comprises a second MOSFET. The circuit may further include a resistor coupled between the first terminal of the first capacitor and the third reference node and/or a third diode coupled between the control terminal of the second transistor and the reference terminal of the second transistor.

In accordance with a further embodiment, a circuit includes a switching transistor having a reference terminal coupled to a first reference node, a control terminal configured to be coupled to a switch control signal, a normally on transistor having a reference terminal coupled to an output terminal of the switching transistor and an output terminal configured to be coupled to a load terminal, a first resistor having a first terminal coupled to a control terminal of the normally on transistor and a second terminal coupled to the reference terminal of the normally on transistor, and a first diode coupled between a second reference node and the control terminal of the normally on transistor. The switching transistor may include a MOSFET and the normally on transistor may include a JFET.

Advantages of various embodiments include the ability of using transistors having blocking voltages that are less than the maximum voltage seen by a semiconductor switch during operation. By using transistors having lower blocking voltages, the size and cost of a power supply system may be reduced. Further advantage embodiments in which the drain-source voltages of switch transistors are well defined during turn on and turn off include the ability to use transistors that do not match each other. In some embodiments, this allows flexibility in system design and may result in cost savings in comparison to other systems. An additional benefit of various embodiments includes reduced negative influence of transistor parasitic capacitances. In some embodiments, balancing circuitry reduces parasitic capacitances and improves predictability of transient circuit behavior leading to better defined circuit component requirements.

In reference to further advantages in low power and high voltage applications, various embodiments described herein provide low cost and high efficiency solutions which are effective alternatives to a high voltage single IGBT switch. Various improvements may include reduced power consumption and higher achievable frequencies.

Although present embodiments and its advantages have been described in detail, it should be understood that various changes, substitutions and alterations can be made herein without departing from the spirit and scope of the invention as defined by the appended claims. For example, many of the features and functions discussed above can be implemented with various circuit elements and transistors of different device types.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
    a first transistor having a reference terminal coupled to a first reference node, and a control terminal configured to be coupled to a switch control signal;
    a second transistor having a reference terminal coupled to an output terminal of the first transistor and an output terminal configured to be coupled to a load;
    a control circuit coupled to a control terminal of the second transistor and to the reference terminal of the second transistor, wherein the control circuit is configured to:
        couple a second reference node to the control terminal of the second transistor during a first mode of operation, wherein the second reference node is configured to have a voltage potential operable to turn-on the second transistor;
        couple a floating reference voltage between the control terminal of the second transistor and the reference terminal of the second transistor during a second mode of operation and during a third mode of operation, wherein the floating reference voltage is operable to turn on the second transistor; and
        couple a third reference node to the reference terminal of the second transistor during the third mode of operation.

2. The circuit of claim 1, wherein:
    the first reference node is a ground node; and
    a voltage difference between the third reference node and the ground node is configured to be greater than a voltage difference between the second reference node and the ground node.

3. The circuit of claim 2, wherein:
    the first transistor comprises a first n-channel MOSFET transistor; and
    the second transistor comprises a second n-channel MOSFET transistor.

4. The circuit of claim 3, wherein the control circuit is further configured to bias the second n-channel MOSFET transistor in a linear region during the second and third mode of operation.

5. The circuit of claim 1, wherein the control circuit comprises:
    a capacitor comprising a first terminal coupled to the control terminal of the second transistor; and
    a first resistor coupled between the reference terminal of the second transistor and a second terminal of the capacitor.

6. The circuit of claim 5, wherein the control circuit further comprises:
    a first diode coupled between the second reference node and the control terminal of the second transistor; and
    a second diode coupled between the second terminal of the capacitor and the third reference node.

7. The circuit of claim 1, wherein the control circuit is further configured to provide a current path from the reference terminal of the second transistor to the third reference node during the third mode of operation.

8. The circuit of claim 1, further comprising a transformer having a first winding coupled between the third reference node and the output terminal of the second transistor.

9. The circuit of claim 1, wherein:
    the first transistor is on during the first mode of operation;
    the first transistor is off and a voltage at the output terminal of the second transistor is below a first threshold during the second mode of operation; and
    the first transistor is off and a voltage at the output terminal of the second transistor is above the first threshold during the third mode of operation.

10. A method of operating a first transistor having a reference terminal coupled to a first reference voltage, and a control terminal configured to be coupled to a switch control signal, and a second transistor having a reference terminal operatively coupled to an output terminal of the first transistor and an output terminal configured to be coupled to a load, wherein the method comprises:
- turning on the first transistor by applying an activation signal to the control terminal of the first transistor;
- applying a turn-on voltage between a control terminal of the second transistor and the reference terminal of the second transistor, wherein the turn-on voltage biases the second transistor in an on-state;
- turning off the first transistor by applying a deactivation signal to the control terminal of the first transistor;
- sampling the turn-on voltage between the control terminal of the second transistor and the reference terminal of the second transistor; and
- clamping the reference terminal of the second transistor to a third reference voltage when a voltage at the output terminal of the second transistor exceeds the third reference voltage.

11. The method of claim 10, wherein clamping further comprises limiting current through the second transistor when the voltage at the output terminal of the second transistor exceeds the third reference voltage.

12. The method of claim 11, wherein:
- clamping further comprises forward biasing a diode coupled between the third reference voltage and the reference terminal of the second transistor; and
- limiting current though the second transistor comprises limiting current though a resistor coupled between the reference terminal of the second transistor and the third reference voltage.

13. The method of claim 10, wherein:
- applying the turn-on voltage further comprises coupling a second reference voltage to the control terminal of the second transistor; and
- sampling the turn-on voltage further comprises decoupling the second reference voltage from the control terminal of the second transistor, wherein the turn-on voltage is sampled on a capacitor coupled between the control terminal of the second transistor and the reference terminal of the second transistor.

14. The method of claim 13, wherein:
- coupling the second reference voltage comprises forward biasing a diode coupled between the second reference voltage and control terminal of the second transistor; and
- decoupling the second reference voltage comprises reverse biasing the diode coupled between the second reference voltage and the control terminal of the second transistor.

15. The method of claim 10, further comprising driving a winding of a transformer with the output terminal of the second transistor.

16. A circuit comprising:
- a first transistor having a reference terminal coupled to a first reference node, and a control terminal configured to be coupled to a switch control signal;
- a second transistor having a reference terminal coupled to an output terminal of the first transistor and an output terminal configured to be coupled to a load terminal;
- a first capacitor having a first terminal coupled to a control terminal of the second transistor and a second terminal coupled to the reference terminal of the second transistor;
- a first diode coupled between a second reference node and the control terminal of the second transistor; and
- a second diode coupled between a third reference node and the second terminal of the first capacitor.

17. The circuit of claim 16, further comprising a resistor coupled between the second terminal of the first capacitor and the reference terminal of the second transistor.

18. The circuit of claim 17, further comprising:
- a third transistor coupled between the output terminal of the second transistor and the load terminal;
- a second capacitor having a first terminal coupled to a control terminal of the third transistor and a second terminal coupled to a reference terminal of the third transistor;
- a fourth diode coupled between the second reference node and the control terminal of the third transistor; and
- a fifth diode coupled between a fourth reference node and the second terminal of the second capacitor.

19. The circuit of claim 17, further comprising a transformer having a first terminal of a winding coupled to the output terminal of the second transistor.

20. The circuit of claim 19, wherein a second terminal of the first winding is coupled to the third reference node.

21. The circuit of claim 16, wherein:
the first transistor comprises a first MOSFET; and
the second transistor comprises a second MOSFET.

22. The circuit of claim 16, further comprising a resistor coupled between the first terminal of the first capacitor and the third reference node.

23. The circuit of claim 16, further comprising a third diode coupled between the control terminal of the second transistor and the reference terminal of the second transistor.

24. A circuit comprising:
- a switching transistor having a reference terminal coupled to a first reference node having a first reference voltage, and a control terminal configured to be coupled to a switch control node;
- a normally on transistor having a reference terminal coupled to an output terminal of the switching transistor and an output terminal configured to be coupled to a load terminal;
- a first resistor having a first terminal coupled to a control terminal of the normally on transistor and a second terminal coupled to the reference terminal of the normally on transistor; and
- a first diode coupled between a second reference node having a second reference voltage and the control terminal of the normally on transistor, wherein the second reference node is separate from the switching control node.

25. The circuit of claim 24, wherein:
the switching transistor comprises a MOSFET; and
the normally on transistor comprises a JFET.

* * * * *